(12) United States Patent
Tsujiguchi

(10) Patent No.: US 6,791,434 B2
(45) Date of Patent: Sep. 14, 2004

(54) FLAT GROUP-DELAY LOW-PASS FILTER, MOUNTING STRUCTURE THEREOF, FLAT GROUP-DELAY LOW-PASS FILTER DEVICE, AND OPTICAL SIGNAL RECEIVER

(75) Inventor: Tatsuya Tsujiguchi, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 88 days.

(21) Appl. No.: 10/207,763

(22) Filed: Jul. 31, 2002

(65) Prior Publication Data

US 2003/0034796 A1 Feb. 20, 2003

(30) Foreign Application Priority Data

Aug. 10, 2001 (JP) .................................... 2001-244567
Jun. 10, 2002 (JP) .................................... 2002-169172

(51) Int. Cl.[7] .................................................. H03H 7/00
(52) U.S. Cl. .................................... 333/172; 333/175
(58) Field of Search .................................... 333/156, 172, 333/175, 167, 204

(56) References Cited

U.S. PATENT DOCUMENTS

| | | | | |
|---|---|---|---|---|
| 3,609,601 A | * | 9/1971 | Phillips | 333/192 |
| 5,491,367 A | * | 2/1996 | Schinzel | 307/106 |
| 5,625,894 A | * | 4/1997 | Jou | 455/78 |
| 6,453,157 B1 | * | 9/2002 | Roberts | 455/337 |
| 6,552,629 B2 | * | 4/2003 | Dixon et al. | 333/172 |
| 6,590,476 B2 | * | 7/2003 | Lee et al. | 333/204 |
| 6,608,536 B2 | * | 8/2003 | Fallahi | 333/168 |

FOREIGN PATENT DOCUMENTS

| | | |
|---|---|---|
| DE | 1 262 467 | 3/1968 |
| EP | 0 566 145 A2 | 10/1993 |
| JP | 9-270655 | 10/1997 |

* cited by examiner

Primary Examiner—Michael Tokar
Assistant Examiner—Khai M. Nguyen
(74) Attorney, Agent, or Firm—Keating & Bennett, LLP

(57) ABSTRACT

A flat group-delay low-pass filter includes a series element connected between an input terminal and an output terminal, and a shunt element with one end thereof grounded. Inductors define the series element, a parallel circuit including a capacitor and a series circuit including a resistor and a capacitor defines the shunt element. The flat group-delay low-pass filter thus eliminates the need for inserting a fixed attenuator to control the effect of reflections due to impedance mismatching between the filter and other components. The resulting flat group-delay low-pass filter and an optical signal receiver including the filter have very low manufacturing costs and component costs.

17 Claims, 16 Drawing Sheets

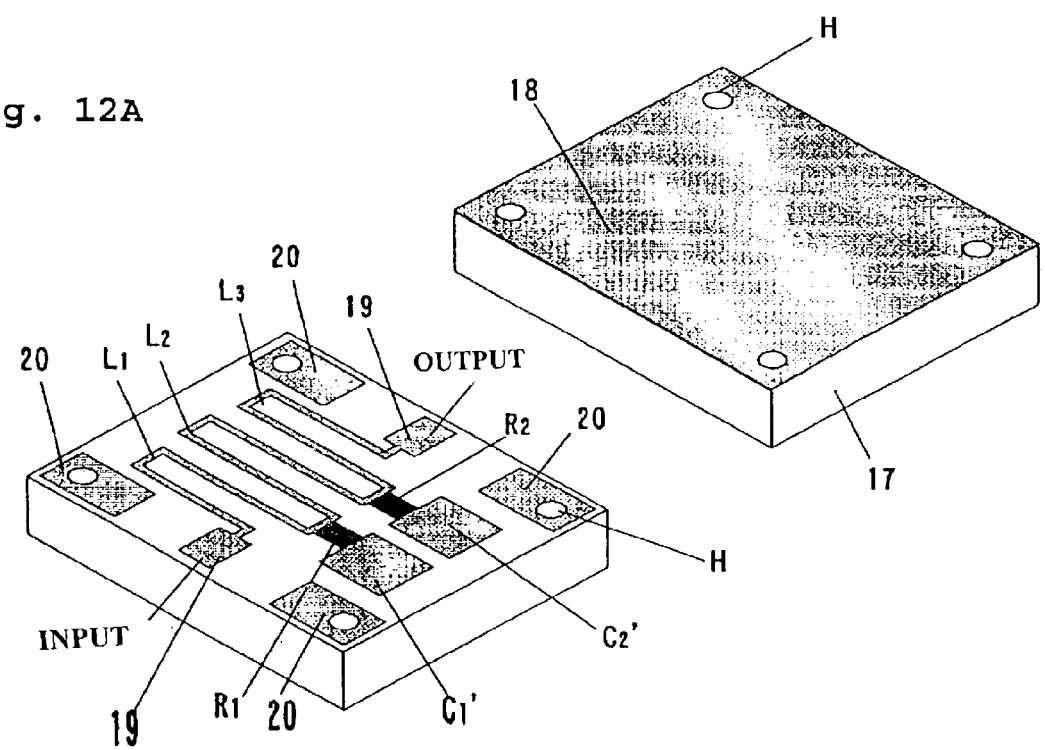

FLAT GROUP-DELAY LOW-PASS FILTER, MOUNTING STRUCTURE THEREOF, FLAT GROUP-DELAY LOW-PASS FILTER DEVICE, AND OPTICAL SIGNAL RECEIVER

BACKGROUND OF THE INVENTION

1. Field of the Invention

The present invention relates to a flat group-delay low-pass filter which prevents and minimizes degradation in a signal waveform with flat group-delay characteristics and attenuates out-of-band noise, and also relates to an optical signal receiver including such a flat group-delay low-pass filter.

2. Description of the Related Art

A Bessel low-pass filter can be used to remove a noise component and to improve an error rate in digital communications using an optical fiber.

The Bessel low-pass filter is a ladder-type circuit including an inductor defining a series element and a capacitor defining a shunt element with the one end thereof grounded. To provide flat group-delay characteristics, the argument arg T of the transfer function $T(j\omega)$ of the filter is approximately proportional to the frequency. If the number of stages of the filter is determined, the values of circuit elements are automatically determined. The value of elements are easily calculated using normalization parameters of a standard low-pass filter, such as those described in "Handbook of FILTER SYNTHESIS" authored by A. I. Zverev.

FIG. 19 shows a circuit arrangement of a four-stage Bessel low-pass filter. FIGS. 20A and 20B show transmission characteristics, reflective characteristics, and group-delay characteristics. Referring to FIG. 19, $L_1$ and $L_2$ are inductors defining series elements, and $C_1$ and $C_2$ are capacitors defining shunt elements. As shown in FIG. 20A, S11 represents reflective characteristics, and S21 represents transmission characteristics. In this example, the cut-off frequency (at which a signal is attenuated by 3 dB) is 7.5 GHz. Referring to FIG. 20B, the group-delay characteristic is flat, and distortion of signals in a wide band is controlled, and harmonic noise is removed.

The filter illustrated in FIG. 19 has poor reflective characteristics, and suffers from undulation in transmission characteristics due to multiple reflections as a result of mismatching between prior and subsequent stages. To improve reflective characteristics, fixed attenuators are arranged at the front end and back end of the filter.

A fixed attenuator, if inserted for impedance matching, not only causes a transmission loss but also is not economical.

To improve reflective characteristics, Japanese Unexamined Patent Application Publication No. 9-270655 discloses a correction circuit which includes a series circuit having a capacitor and a parallel circuit having an inductor and a resistor, and is used as a shunt element for a Bessel low-pass filter. FIG. 21 illustrates the internal construction of the filter in the above-described publication. Referring to FIG. 21, $R_1$–$R_4$ are resistors, $C_1$–$C_4$ are capacitors, and $L_1'$–$L_4'$ are inductors. $L_1$–$L_4$ are inductors constructed of metal ribbons. Support insulators 5, 6, 7, and 8 are bonded to a metal plate 4 for supporting the inductors $L_1$, $L_2$, and $L_3$ defining series elements.

FIG. 22 is a circuit diagram of the filter shown in FIG. 21. FIG. 22 shows only four stages of the filter. Referring to FIG. 22, $L_w$ is an inductance of a wire connecting each of resistors $R_1$ and $R_2$ to another element.

In the filter illustrated in FIG. 21, the inductance varies depending on variations in the length of each wire connecting each of the resistors $R_1$–$R_4$ to other elements, and the group-delay characteristics of the filter change significantly. For this reason, the characteristics need to be adjusted, thereby increasing the manufacturing cost of the filter. Furthermore, this arrangement must use an inductor, having an inductance that is larger than that of the series element, such as a spiral inductor defining the shunt element. Such an inductor is expensive compared with the capacitor or the resistor, thereby increasing the cost of the filter.

SUMMARY OF THE INVENTION

In order to overcome the problems described above, preferred embodiments of the present invention provide a flat group-delay low-pass filter which eliminates the need for arranging fixed attenuators at the front end and the back end of the filter with the attenuators for controlling the effect of reflections caused by impedance mismatching with components arranged in front of and in back of the filter, and which is low in manufacturing costs and component costs, and to provide an optical signal receiver including such a novel flat group-delay low-pass filter.

Preferred embodiments of the present invention also provide a flat group-delay low-pass filter including a series circuit having a capacitor and a resistor with one end of the series circuit grounded, defining a shunt element, and an inductor defining a series element.

In this arrangement, the resistance component of the series circuit has a frequency characteristic such that the flat group-delay low-pass filter has an ideally flat group-delay characteristic in a low frequency range while a signal is absorbed by the resistor in a high frequency range.

Preferably, each of the inductor and the capacitor includes an electrode pattern on the dielectric substrate, and the resistor includes a resistive film pattern on the dielectric substrate. This arrangement eliminates variations in characteristics due to variations in wires, thereby making the adjustment of the characteristics of the filter unnecessary.

Preferably, the inductor includes a micro strip line having a ground electrode arranged on the bottom surface of a dielectric substrate and a line electrode pattern disposed on the top surface of the dielectric substrate, and the line electrode pattern of the micro strip line is constructed such that the characteristic impedance of the micro strip line is larger than about 50 Ω, and an electrode for external connection connected to the electrode pattern of the micro strip line is disposed on the top surface of the dielectric substrate.

Preferably, the line electrode pattern is manufactured using a thin-film formation process with the outermost surface thereof being formed of Au, and the resistive film pattern is preferably formed of a tantalum oxide film using a thin-film formation process.

Preferably, the flat group-delay low-pass filter further includes a ground electrode pattern connected to the ground electrode and arranged on at least one of the two side regions of the external connection electrode.

Preferably, the flat group-delay low-pass filter further includes a protective layer covering the inductor, the capacitors and the resistor on the dielectric substrate.

Preferably, the external connection electrode is connected to an external circuit through a wire.

Preferably, the flat group-delay low-pass filter further includes a side electrode extending from the external connection electrode and arranged on the side wall of the dielectric substrate.

Preferably, the flat group-delay low-pass filter further includes a bump, disposed on at least the external connection electrode on the top surface of the dielectric substrate, for flip-chip bonding.

Preferably, a flat group-delay low-pass filter device of preferred embodiments of the present invention includes one of the above-referenced flat group-delay low-pass filters and a package base on which the flat group-delay low-pass filter is mounted, wherein the package base has a thick-film terminal electrode for surface-mounting, whereby the package base is surface-mounted on a board of an electronic apparatus such as an optical signal receiver.

An optical signal receiver of a preferred embodiment of the present invention includes a photoelectric converter circuit for converting a received optical signal into an electrical signal, and the flat group-delay low-pass filter that receives an electrical signal into which the photoelectric converter circuit converts the optical signal, and attenuates a high-frequency component of the electrical signal. In digital communications using an optical fiber, out-of-band noise is reduced without degrading the waveform of the signal.

Other features, elements, characteristics and advantages of the present invention will become more apparent from the following detailed description of preferred embodiments thereof with reference to the attached drawings.

BRIEF DESCRIPTION OF THE DRAWINGS

FIGS. 12A and 12B are external perspective views of the flat group-delay low-pass filter in accordance with another preferred embodiment of the present invention;

DETAILED DESCRIPTION OF PREFERRED EMBODIMENTS

Figure 1A:
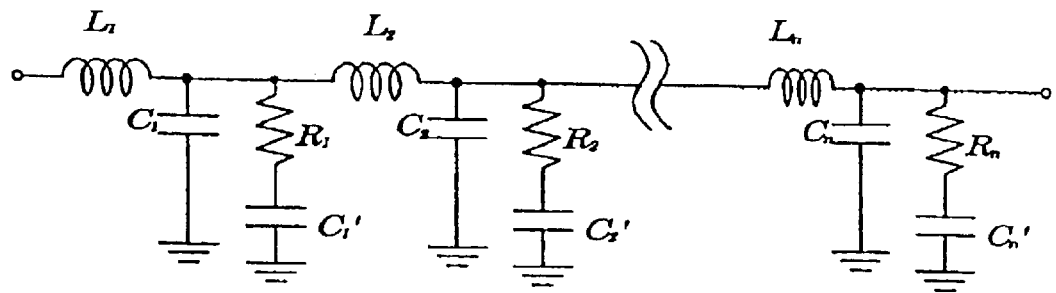
FIGS. 1A through 1C show circuit arrangements of flat group-delay low-pass filters according to preferred embodiments of the present invention.
Figure 1B:
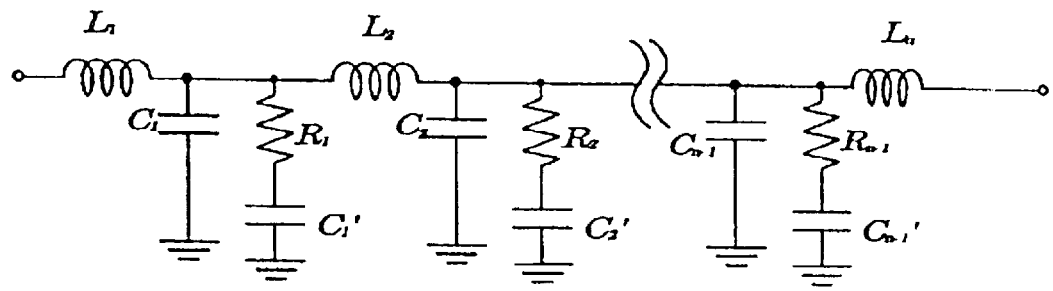
Figure 1C:
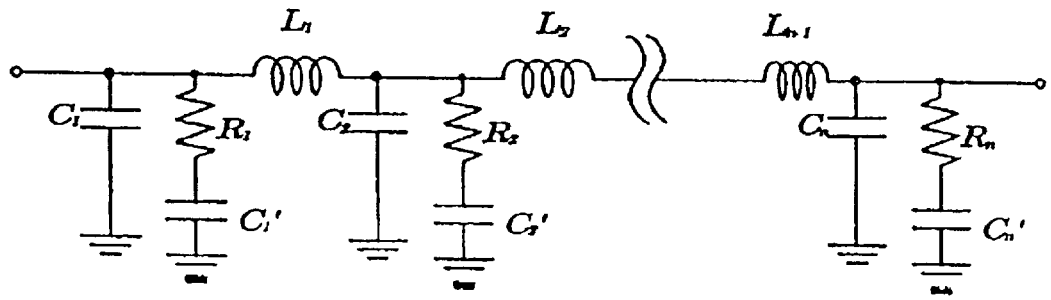

Referring to FIGS. 1A through 1C, $L_1$ through $L_n$ are inductors defining series elements, $C_1$–$C_n$ are capacitors defining shunt elements, and $R_1$ and $C_1'$, $R_2$ and $C_2'$, ..., $R_n$ and $C_n'$ respectively define series circuits. The series circuits defining shunt elements are respectively connected in parallel with the capacitors $C_1$–$C_n$.

FIG. 1A illustrates a circuit which includes a series element at the input end thereof and a shunt element at the output end thereof. FIG. 1B illustrates a circuit which includes a series element at the input end thereof and a series element at the output end thereof. FIG. 1C illustrates a circuit which includes a shunt element at the input end thereof and a shunt element at the output end thereof. The number of stages of these circuits may be determined depending on required filter characteristics. Depending on requirements, one of Cr (a capacitor as a shunt element at an r-th stage), and a series circuit of Rr and Cr' (a series circuit as a shunt element at the r-th stage) may be dispensed with.

Figure 2:
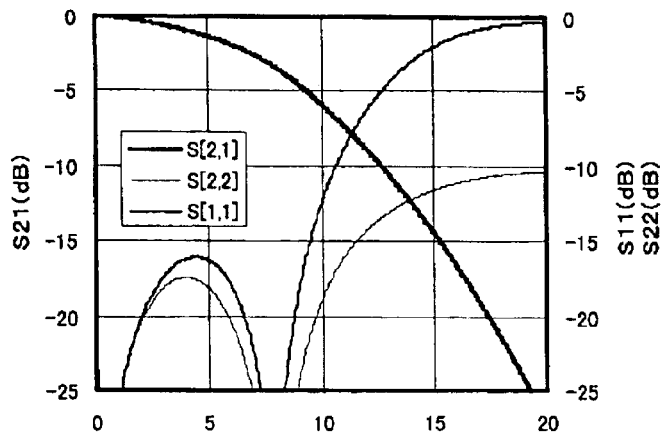
FIG. 2 plots the reflective characteristics and transmission characteristics of the flat group-delay low-pass filter having four stages of the type that is shown in FIG. 1A.

FIG. 2 plots the transmission characteristics (S21) and the reflective characteristics (S11 and S22) of the four-stage flat group-delay low-pass filter illustrated in FIG. 1A. Referring to FIG. 2, a reflection loss at a cutoff frequency of approximately 7.5 GHz is about 15 dB or more. This level of reflection loss is sufficiently large compared with the reflection loss at the cut-off frequency of the ideal Bessel low-pass filter illustrated in FIG. 13, which is 3 dB.

Figure 3:
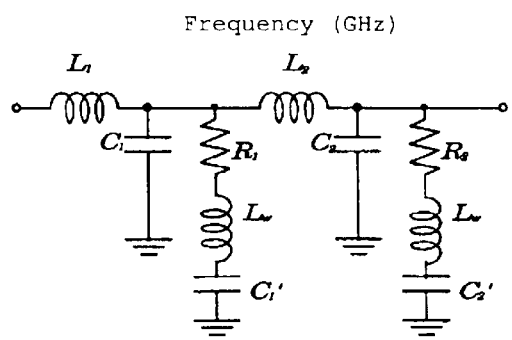
FIG. 3 is an equivalent circuit diagram of the flat group-delay low-pass filter of preferred embodiments of the present invention.

FIG. 3 is an equivalent circuit diagram of the four-stage flat group-delay low-pass filter. The equivalent circuit, different from the one shown in FIGS. 1A through 1C, includes the inductance, represented by $L_w$, of the wire connecting a resistor R to another element.

Figure 4:
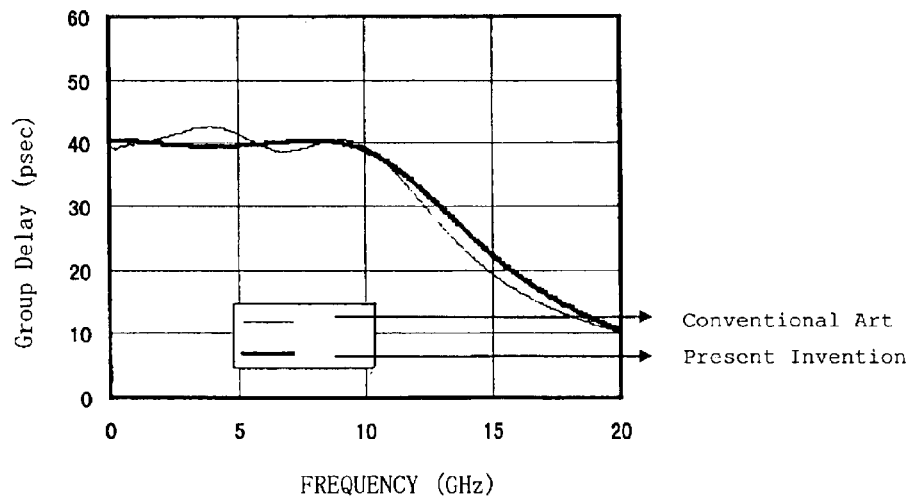
FIG. 4 compares the group-delay characteristics of the flat group-delay low-pass filter of preferred embodiments of the present invention with those of a conventional filter.
Figure 15:
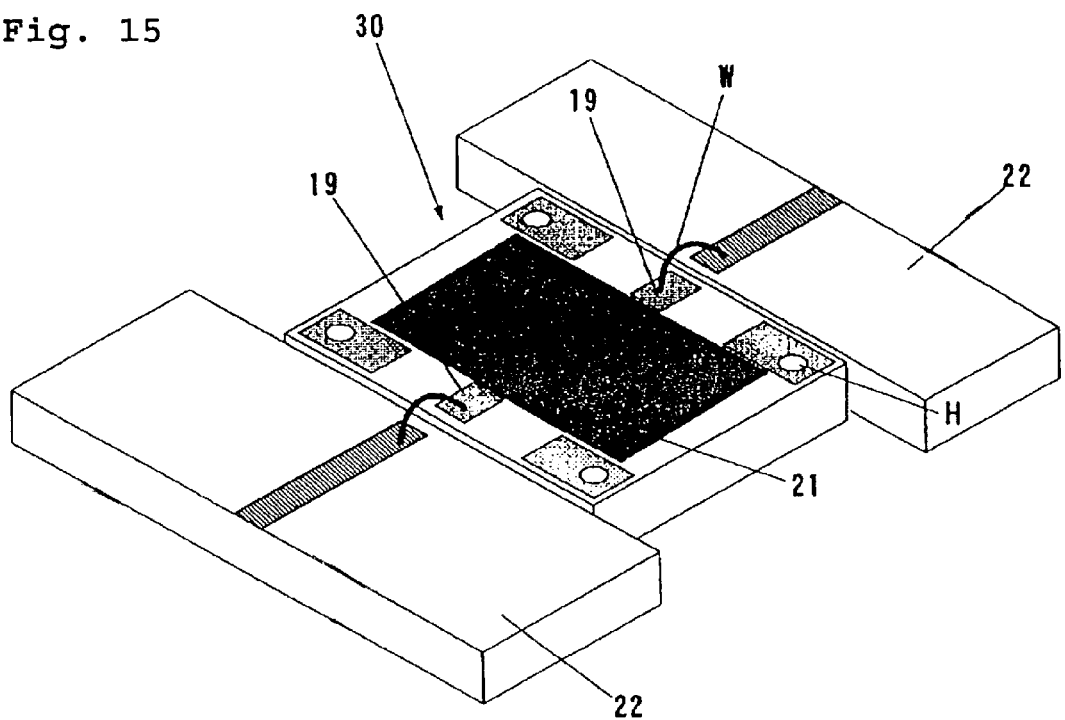
FIG. 15 is an external perspective view of the flat group-delay low-pass filter in accordance with another preferred embodiment of the present invention in the mounted state thereof.

FIG. 4 illustrates the group-delay characteristics of the filter in the preferred embodiment shown in FIG. 3 and a conventional filter shown in FIG. 15. As is clear from FIG. 4, a deviation in the group-delay characteristics of the filter of this preferred embodiment is smaller than that in the group-delay characteristics of the conventional filter. Specifically, the flat group-delay low-pass filter of the present invention is less susceptible to an equivalent inductance generated in series with the resistor. Even when the resistor is connected through the wire, the characteristics of the filter suffer less from variations.

The flat group-delay low-pass filter of a second preferred embodiment is discussed below with reference to FIG. 5.

Figure 5:
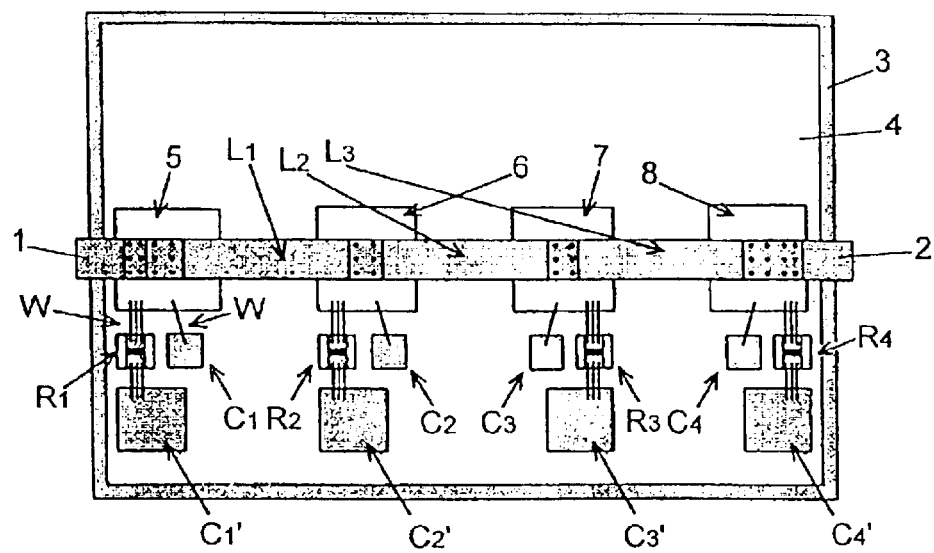
FIG. 5 specifically illustrates the internal structure of the flat group-delay low-pass filter in accordance with another preferred embodiment of the present invention.

FIG. 5 specifically illustrates the internal structure of the filter. Referring to FIG. 5, $R_1$–$R_4$ are resistors, and $C_1$–$C_4$ and $C_1'$–$C_4'$ are capacitors. $L_1$–$L_3$ are inductors, each preferably made of a metal ribbon. Support insulators 5, 6, 7, and 8 are bonded to a metal plate 4 for supporting the inductors $L_1$, $L_2$, and $L_3$ as series elements.

In this preferred embodiment, the resistors $R_1$–$R_4$, the capacitors $C_1$–$C_4$ and $C_1'$–$C_4'$, and the inductors $L_1$–$L_3$ are all discrete components. The resistors $R_1$–$R_4$ are respectively connected to top surface electrodes on the supports 5–8 through wires W, and are also respectively connected to the top surface electrodes of the capacitors $C_1'$–$C_4'$ through wires W. Similarly, the top surface electrodes on the supports 5–8 are respectively connected to the capacitors $C_1$–$C_4$ through wires W. Each of the inductors $L_1$, $L_2$, and $L_3$ is preferably made of a metal ribbon. The inductor $L_1$ straddles and is connected between the top surface electrodes on the insulator supports 5 and 6, the inductor $L_2$ straddles and is connected between the top surface electrodes on the insulator supports 6 and 7, and the inductor $L_3$ straddles and is connected between the top surface electrodes of the insulator supports 7 and 8.

Figure 21:
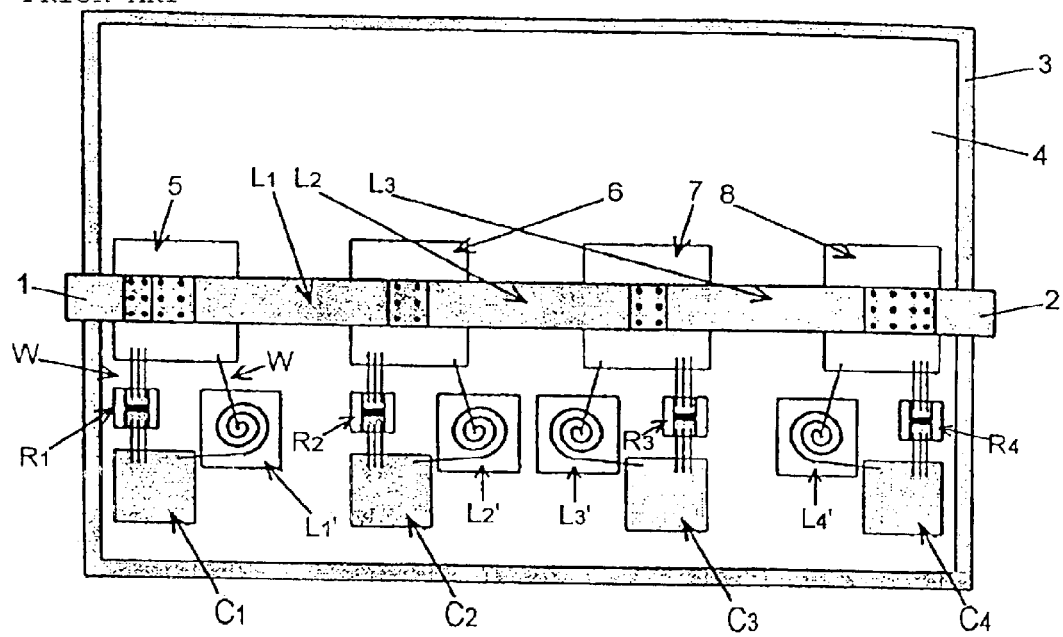
FIG. 21 illustrates the structure of the conventional flat group-delay low-pass filter.
Figure 22:
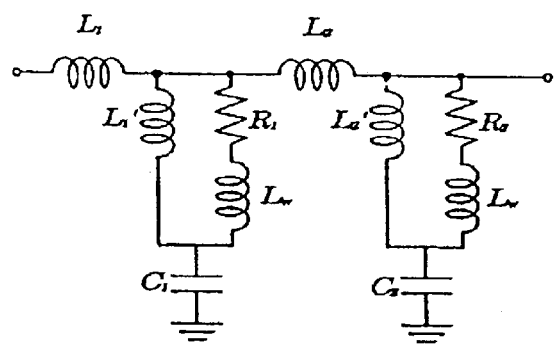
FIG. 22 is an equivalent circuit diagram of the conventional flat group-delay low-pass filter.

As is clear from the comparison of FIG. 5 and FIG. 21, the filter illustrated in FIG. 5 eliminates the need for the spiral inductors $L_1'$–$L_4'$, thereby reducing the number of wires to be connected. In the filter illustrated in FIG. 21, the variations in the characteristics of the filter resulting from variations in the wires respectively connected to the resistors $R_1$–$R_4$ are adjusted by reducing the top surface electrodes of the capacitors $C_1$–$C_4$ as the shunt elements. In accordance with preferred embodiments of the present invention, variations in the characteristics of the filter are small enough to eliminate the need for the adjustment of the characteristics.

The construction of the flat group-delay low-pass filter in accordance with a third preferred embodiment of the present invention is discussed below with reference to FIG. 6.

Figure 6:
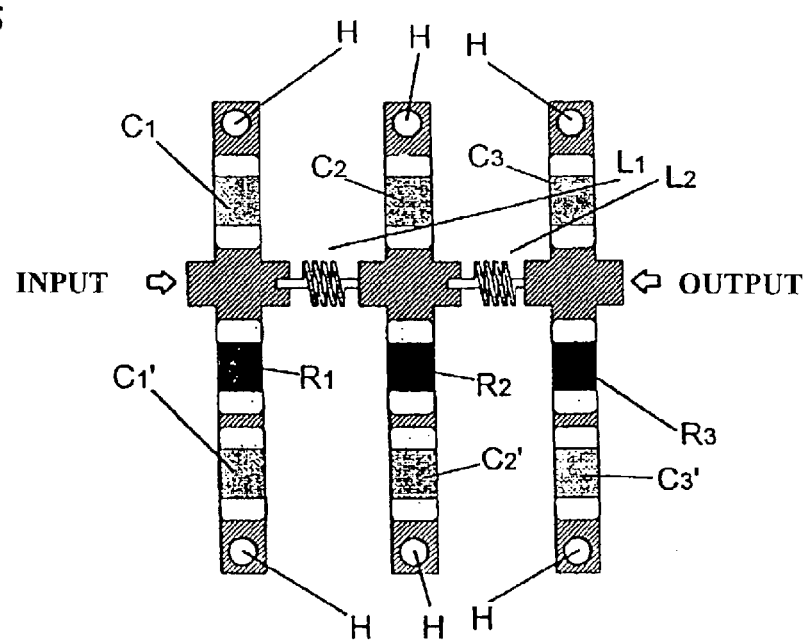
FIG. 6 is a layout view of an electrode pattern and components arranged thereon on the flat group-delay low-pass filter in accordance with another preferred embodiment of the present invention.

FIG. 6 illustrates the layout of the electrode pattern disposed on a substrate and components mounted on the pattern. Referring to FIG. 6, $R_1$–$R_3$ are resistors, $C_1$–$C_3$ and $C_1'$–$C_3'$ are capacitors, and these components are all chip components. $L_1$ and $L_2$ are inductors, each being an air-core coil. Through holes H lead to ground electrodes disposed on the bottom surface of the substrate.

This filter is of the type illustrated in FIG. 1C, and has five stages.

The inductors $L_1$ and $L_2$ may be a chip coil instead of the air-core coil.

The third preferred embodiment provides a low-cost flat group-delay low-pass filter using widely available chip components and a low-cost substrate.

The flat group-delay low-pass filter of a fourth preferred embodiment is discussed below with reference to FIG. 7.

Figure 7:
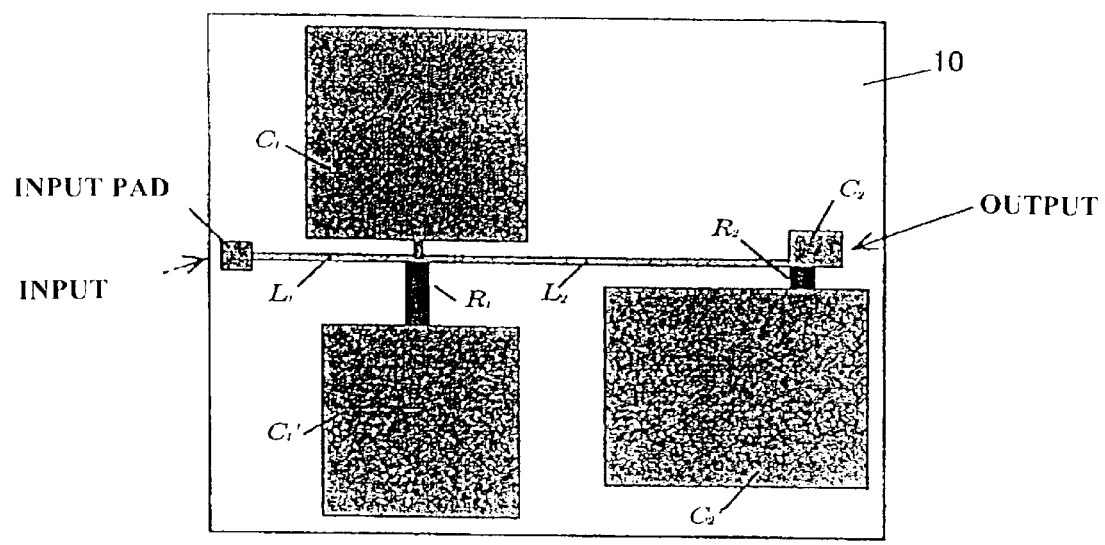
FIG. 7 is a plan view of a substrate housed in a case of the flat group-delay low-pass filter in accordance with another preferred embodiment of the present invention.

FIG. 7 is a plan view of a substrate housed in the case of the filter. Referring to FIG. 7, four electrode patterns $C_1$, $C_2$, $C_1'$, and $C_2'$, two resistor patterns $R_1$ and $R_2$, and inductor patterns $L_1$ and $L_2$ are comprised of thin films disposed on the top surface of a circuit chip board 10. In this example, the capacitor electrode $C_2$ also defines an output pad. Through wires, the input pad and the output pad are respectively connected to an input pad and an output pad on a different dielectric substrate on which the circuit chip substrate 10 is mounted.

This arrangement results in the type of the four-stage flat group-delay low-pass filter illustrated in FIG. 1A.

The circuit chip substrate 10 may be a fired ceramic single layered substrate, a fired ceramic multi-layered substrate, or a resin substrate. The electrode pattern and the resistor pattern may be formed via a thick-film forming process or the thin-film forming process.

In the thick-film forming process, the electrode pattern or the resistor film pattern is formed by screen-printing an electrode material such as an Au paste, or a resistor material such as ruthenium into a pattern, and then by firing the pattern. In the thin-film forming process, an electrode material such as an Au paste, or a resistor material such as ruthenium is entirely layered on the substrate through deposition, sputtering, or plating. Resist is then formed on the layer using the photolithographic process, and then unwanted portions of the metal layer are removed through etching. Alternatively, after forming a resist pattern through the photolithographic process, the electrode material or the resistor material is deposited on portions of the substrate other than the regions of the resist pattern through deposition, sputtering, or plating, and then the resist pattern is peeled off.

The capacitor electrodes $C_1$, $C_2$, $C_1'$, and $C_2'$ are not limited to the substantially rectangular shape as shown. The capacitor electrodes may be substantially triangular, circular, sectorial, or rhombic, or other suitable shape. Depending on specific requirements, the inductor as the series element may be a spiral type or other suitable type. The capacitor as the shunt element may be an MIM (Metal Insulator Metal).

The resistor, the inductor, and the capacitor are thus patterned on the substrate. Variations in the characteristics thereof are small compared with the case in which individual components are connected through ribbons or wires. There is no need for adjustment in characteristics, and the manufacturing yield of the filters is thus greatly improved. Since the major components in the filter are accommodated within the area of a single dielectric material, a compact filter results.

The method of converting the inductor as the series element into a strip line is discussed below.

Let Za represent the characteristic impedance of the line and θ represent the electrical angle of the line, and the F parameters of the line are expressed by the following equation.

$$\begin{bmatrix} A & B \\ C & D \end{bmatrix}_{Line} = \begin{bmatrix} \cos\theta & jZ_a\sin\theta \\ j\sin\theta/Z_a & \cos\theta \end{bmatrix} \quad (1)$$

The F parameters of a π type circuit of parallel capacitors and a series inductor are determined by the following equation.

$$\begin{bmatrix} A & B \\ C & D \end{bmatrix}_{LC} = \begin{bmatrix} 1-\omega^2 LC & j\omega L \\ \dfrac{j\omega L + 2/j\omega C}{(1/j\omega C)^2} & 1-\omega^2 LC \end{bmatrix} \quad (2)$$

Equations (1) and (2) become identical by substituting equations (3) and (4).

$$Z_a \sin\theta = \omega L \quad (3)$$

$$\omega C = (1-\cos\theta)/Z_a \sin\theta = \tan(\theta/2)/Z_a \quad (4)$$

By canceling the capacitance expressed in equation (4) generated at both ends of the inductance L with the inductance L, the inductance L is converted into a line having a characteristic impedance Za and an electrical angle θ. If the magnitude of the inductance defining the series element is large, a spiral inductor or a meandering inductor may be disposed on the substrate.

The inductor includes a strip line rather than a discrete component, and the resistor is disposed of a resistive film. In this way, the filter is free from variations in the filter characteristics due to component assembly, and requires no adjustment in characteristics. Manufacturing costs of the filter are thus reduced. Since the mounting area of the inductor is eliminated, the filter becomes compact.

FIG. 7 illustrates the substrate housed in the case. Surface mountable terminal electrodes are arranged on the substrate, and the substrate itself is mounted on another substrate. The filter is thus a surface mountable filter chip.

The construction of the flat group-delay low-pass filter of a fifth preferred embodiment is discussed with reference to FIGS. 8 and 9.

Figure 8:
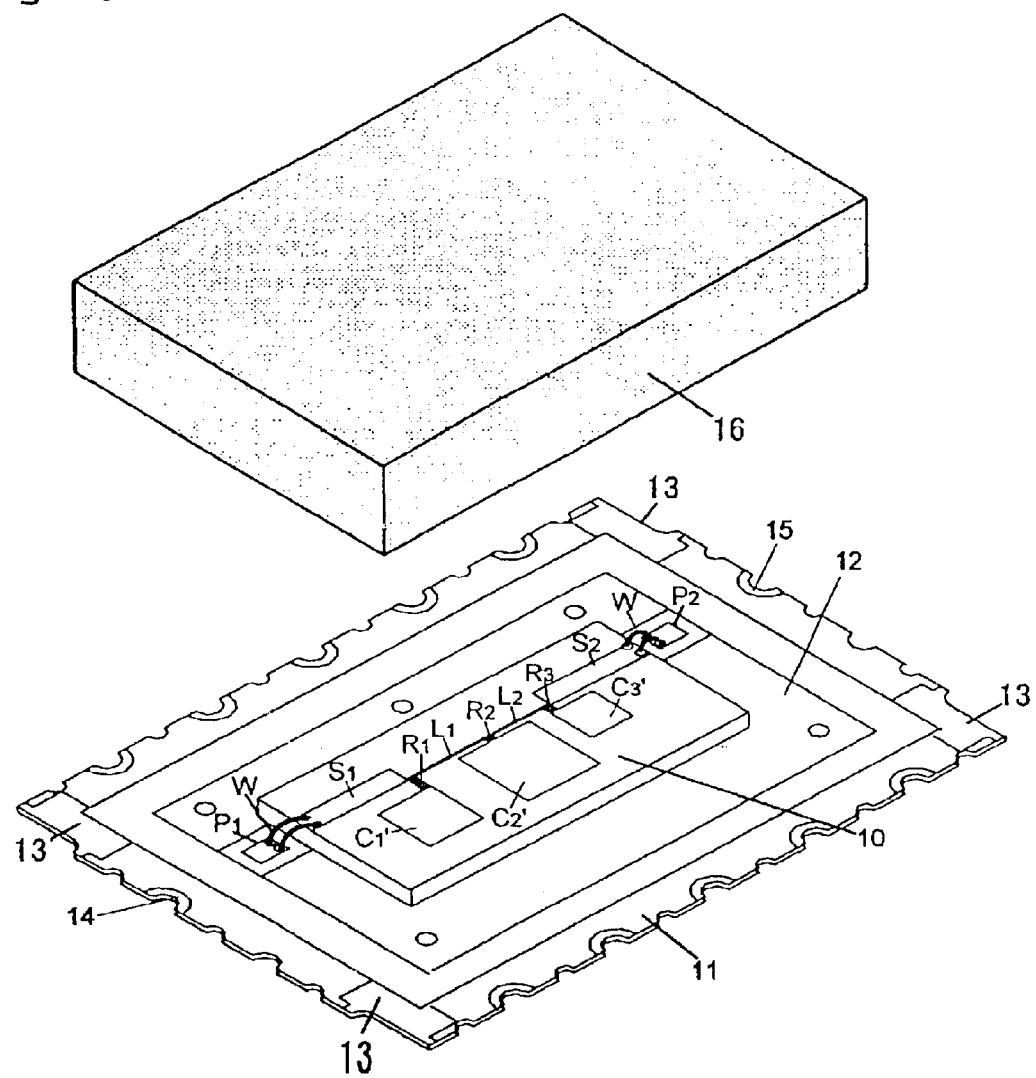
FIG. 8 is an exploded perspective view of the flat group-delay low-pass filter in accordance with another preferred embodiment of the present invention.
Figure 9:
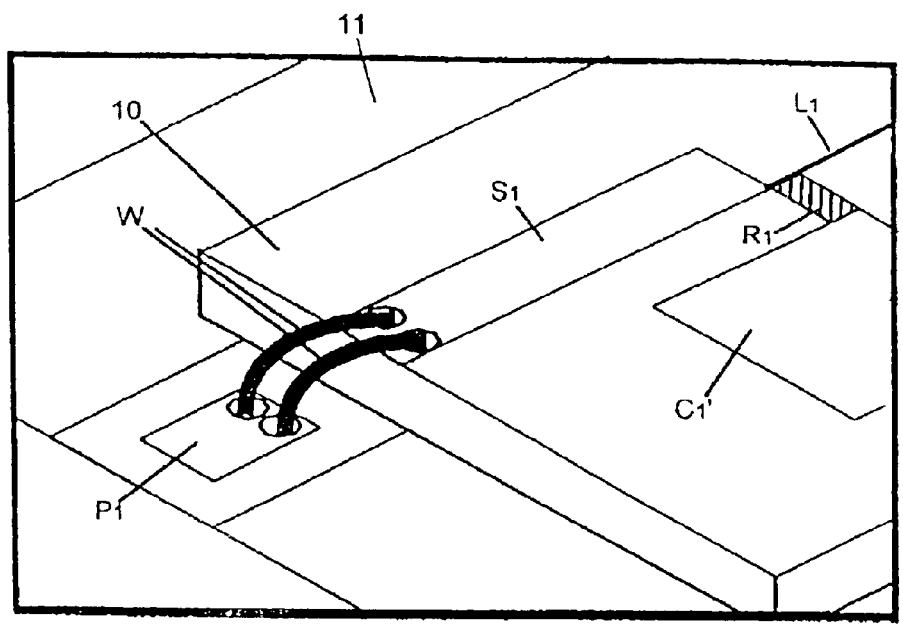
FIG. 9 is an enlarged perspective view of a major portion of the flat group-delay low-pass filter illustrated in FIG. 8.

FIG. 8 is an exploded perspective view of the flat group-delay low-pass filter with the cap thereof removed, and FIG. 9 is an enlarged view of a major portion of the flat group-delay low-pass filter. Referring to FIGS. 8 and 9, a circuit chip substrate 10 includes main components of the filter, namely, a series element and a shunt element. In the fifth preferred embodiment, capacitor electrode patterns $C_1'$, $C_2'$, and $C_3'$, resistor patterns $R_1$, $R_2$, and $R_3$, inductor electrode patterns $L_1$ and $L_2$, and lines (micro strip lines) S1 and S2 are arranged on the circuit chip substrate 10. Each of the lines preferably has a characteristic impedance of about 50 Ω. A ground electrode extends on the entire bottom surface of the circuit chip substrate 10.

A package base 11 mountable on a board has the circuit chip substrate 10 thereon. The package base 11 includes a ground electrode 12, ground terminals 13, an input terminal 14, and an output terminal 15. Since these electrodes and terminals are produced through the thick-film forming process, the package base 11 is surface mountable on the board via solder, for example.

The ground electrode disposed beneath the circuit chip substrate 10 is electrically connected to the ground electrode 12 on the package base 11. An input pad P1 and an output pad P2 isolated from the ground electrode 12 are disposed on the top surface of the package base 11. The pads P1 and P2 are respectively connected to the lines S1 and S2 using two wires W. A metal ribbon may be used instead of the wires.

Referring to FIG. 8, a metal cap 16 is shown. The cap 16 is electrically and mechanically connected to the ground electrode 12 of the package base 11 to cover the circuit chip substrate 10 and the wires W. In this arrangement, the cap 16 and the ground electrode 12 disposed on the package base 11 shield the circuit portion of the filter, thereby preventing electromagnetic waves from being radiated from the surface of the circuit chip substrate 10, and thereby preventing the attenuation characteristics from being degraded.

Figure 10A:
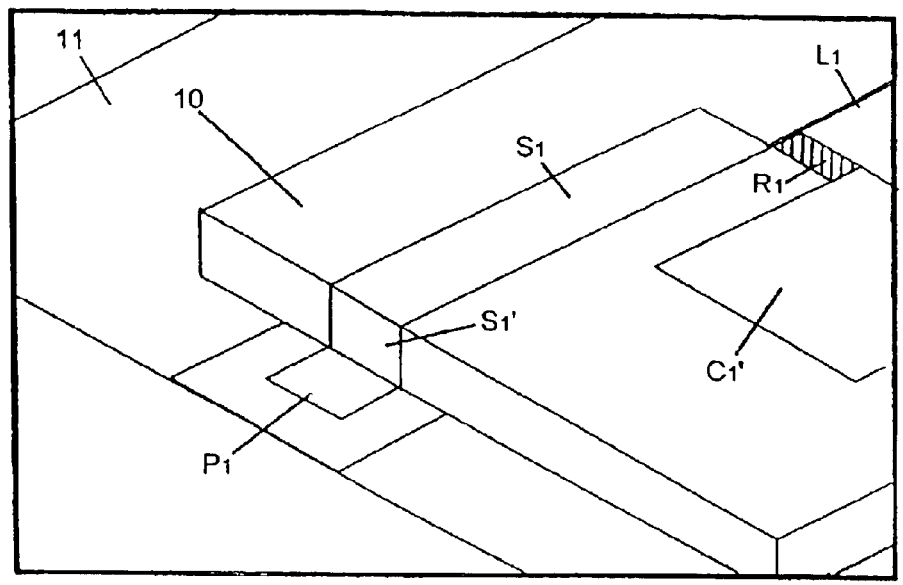
FIGS. 10A and 10B are enlarged perspective views of the flat group-delay low-pass filter in accordance with another preferred embodiment of the present invention.
Figure 10B:
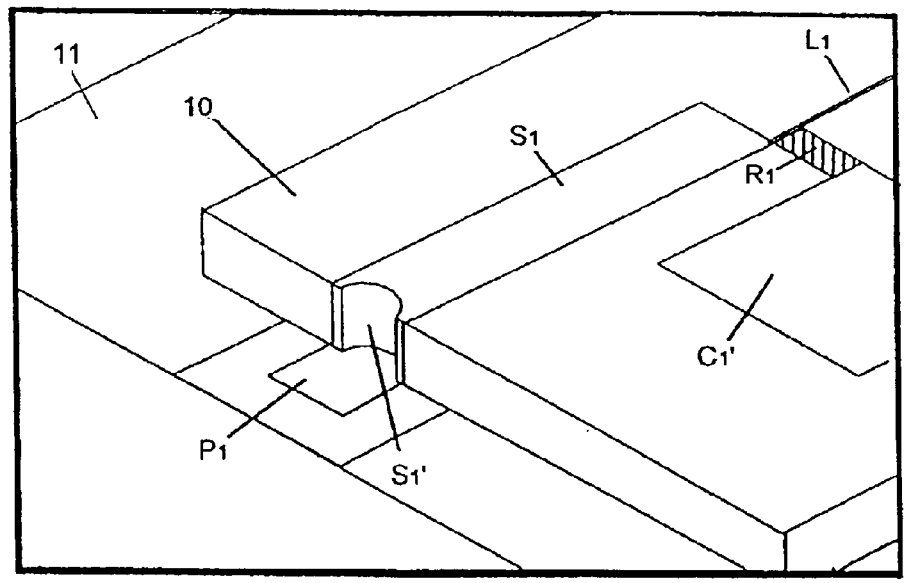

FIGS. 10A and 10B illustrate the major portion of the flat group-delay low-pass filter in accordance with a sixth preferred embodiment of the present invention. Like the major portion illustrated in FIG. 9, the circuit chip substrate 10 is connected to the package base 11 as shown in FIGS. 10A and 10B. In the example illustrated in FIG. 10A, the line S1 is continued to a line S1' on the side surface of the circuit chip substrate 10. The line S1' on the side surface is connected to the input pad P1 on the package base 11 via soldering.

In the example in FIG. 10B, the line S1 is continued to a line S1' which extends in a recess formed in the circuit chip substrate 10.

In the examples illustrated in FIG. 9 and FIGS. 10A and 10B, the circuit chip substrate 10 is mounted on the package base 11 surface-mountable on a board. Like the circuit chip substrates 10 illustrated in FIG. 9 and FIGS. 10A and 10B, the circuit chip substrate 10 illustrated in FIG. 7 may be mounted on a surface mountable package base.

Figures 11A, 11B:
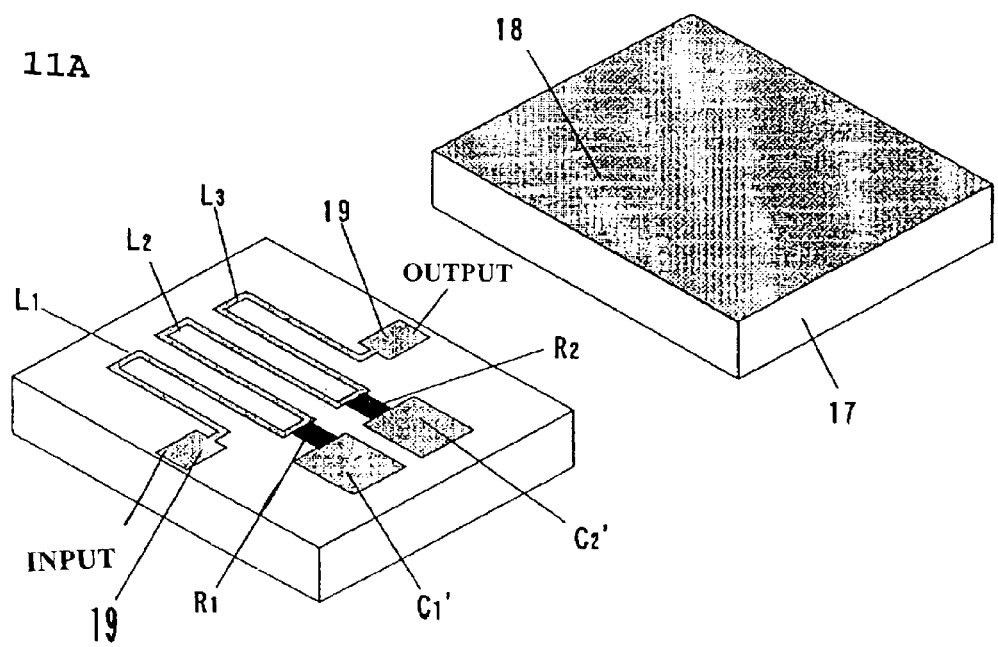
FIGS. 11A and 11B are external perspective views of the flat group-delay low-pass filter in accordance with another preferred embodiment of the present invention.

FIGS. 11A and 11B illustrate the construction of the flat group-delay low-pass filter in accordance with a seventh preferred embodiment of the present invention.

FIG. 11A is an external perspective view of the flat group-delay low-pass filter showing the top surface thereof, and FIG. 11B is an external perspective view of the flat group-delay low-pass filter showing the bottom surface thereof. The electrode on the bottom surface of a dielectric substrate 17 defines a ground electrode 18. Inductors $L_1$, $L_2$, and $L_3$ include a strip line, and electrodes 19 for external connection are arranged on the strip line. Capacitors $C_1'$ and $C_2'$ include top surface electrodes facing the ground electrode 18 with the dielectric substrate 17 interposed therebetween. Resistors $R_1$ and $R_2$ include resistive film patterns on the dielectric substrate 17. In this way, a five-stage flat group-delay low-pass filter chip is produced.

Capacitance expressed in equation (4) is greater than the capacitance of each of capacitors $C_1$ and $C_2$ as the shunt element shown in FIG. 1. If the series element is converted into a line, these capacitors are omitted. For this reason, the shunt elements are defined only by the capacitors $C_1'$ and $C_2'$ connected to the resistors $R_1$ and $R_2$, respectively. The number of elements is thus substantially reduced.

The external connection electrode 19 is typically constructed to have an impedance of about 50 Ω. From equation (3), the larger the characteristic impedance, the greater the inductance L in the lines, given the same electrical angle θ. For this reason, the characteristic impedance of the strip line is typically larger than about 50 Ω. The strip line is thus shortened.

The resistors $R_1$ and $R_2$ include a resistive film, and the capacitors $C_1'$ and $C_2'$ are defined by the top surface electrode facing the ground electrode 18 on the dielectric substrate 17. The filter is thus constructed on the area of the dielectric substrate 17 only.

The filter is miniaturized by substituting the strip line having a characteristic impedance larger than about 50 Ω for the inductor. Furthermore, the number of capacitors is reduced. The filter is thus further miniaturized. Since the filter is constructed on the dielectric substrate 17 only, a more compact filter is produced.

The flat group-delay low-pass filter illustrated in FIG. 11 is a filter chip housed in a filter case. Surface-mountable terminal electrodes are arranged on the filter chip so that the filter chip itself is surface-mountable on another substrate.

A side electrode may be disposed on the side surface of the dielectric substrate, and the ground electrode 18 on the bottom surface may be electrically connected to the ground electrode 20 on the top surface thereof.

The flat group-delay low-pass filter of an eighth preferred embodiment of the present invention and the measurement method for measuring the filter characteristics are discussed below with reference to FIG. 12A through FIG. 13B. FIG. 12A is an external perspective view of the flat group-delay low-pass filter showing the top surface thereof, and FIG. 12B is an external perspective view of the flat group-delay low-pass filter showing the bottom surface thereof. The flat group-delay low-pass filter has ground electrodes 20 on the top thereof, which are connected to the ground electrode 18 on the bottom surface of the substrate through through-holes H. The rest of the construction of the filter remains unchanged from the one illustrated in FIG. 11. The strip line and external connection electrode are patterned through the thin-film process. The strip line and the external connection electrode are plated preferably with Au. The resistive film pattern is preferably made of tantalum.

Figure 13A:
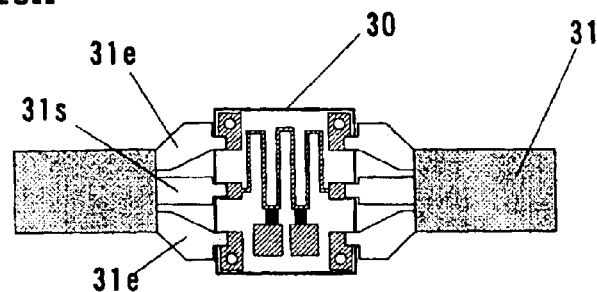
FIGS. 13A and 13B illustrate the setup for measuring the characteristics of the flat group-delay low-pass filter.
Figure 13B:
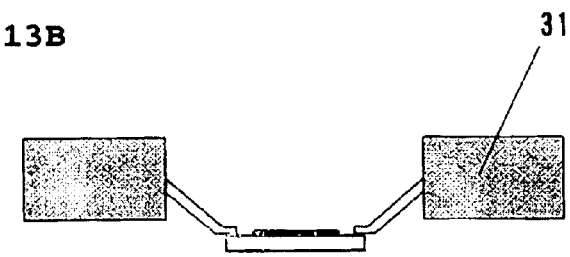

FIGS. 13A and 13B show the measurement method of the filter chip. There are shown the filter chip 30 illustrated in FIG. 12 and a coplanar probe 31 of a measurement device. Also shown are signal lines 31s and ground lines 31e. By simply allowing the coplanar probe 31 to touch the top surface of the filter chip 30, the filter characteristics are measured.

When the input and output portions of the filter include micro strip lines, the ground electrode of the measurement probe needs to be connected to the bottom surface of the filter chip, and the signal electrode of the measurement probe needs to be connected to the external connection electrode of the top surface of the filter chip to measure the high-frequency characteristics of the filter. The construction of the probe becomes extended three-dimensionally, and the manufacturing cost of the measurement probe increases. Such a probe is not appropriate for measuring small components as large as or smaller than about 5 mm.

In the structure illustrated in FIGS. 12A and 12B, and FIGS. 13A and 13B, the input and output portions of the filter have a grounded coplanar structure with the top and bottom ground electrodes and the external connection electrode. As already discussed, the coplanar probe can measure the filter characteristics from the top surface of the filter chip. Calibration of the probe is easily performed on the probe end surface using the SOLT method, and even if the filter chip becomes further compact, the measurement is still possible.

Electrical characteristics of the filter in a wafer are measured prior to dicing of the wafer. This measurement method requires less manufacturing steps and causes less damage such as cracks.

The eighth preferred embodiment thus reduces the cost of the filter, and increases the yield of the filter.

Figure 14A:
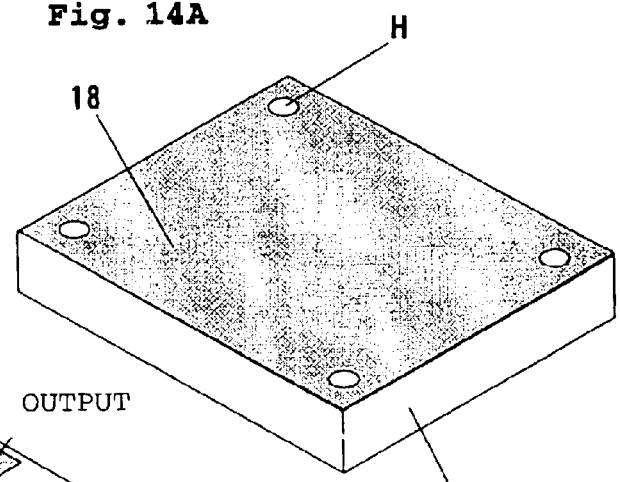
FIGS. 14A and 14B are external perspective views of the flat group-delay low-pass filter in accordance with a further preferred embodiment of the present invention.
Figure 14B:
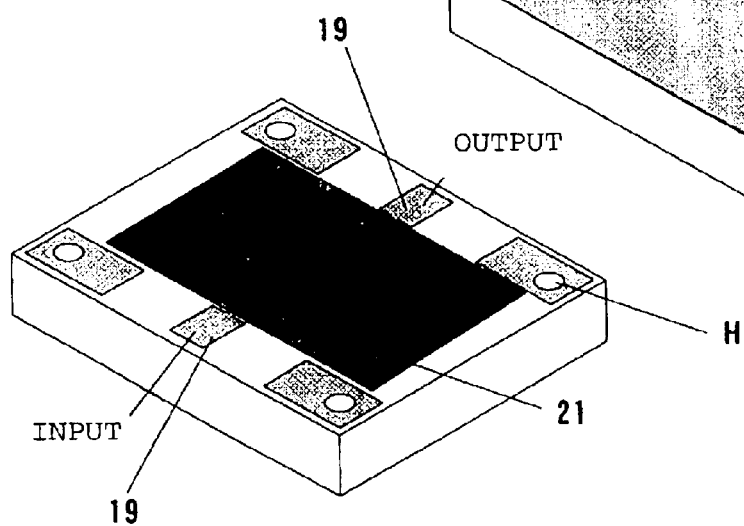

FIGS. 14A and 14B illustrate the flat group-delay low-pass filter in accordance with a ninth preferred embodiment of the present invention. FIG. 14A is an external perspective view illustrating the top surface of the filter, and FIG. 14B is an external perspective view illustrating the bottom surface of the filter. A protective layer 21 covers the electrodes and the resistive film on the top surface of the filter, except an external connection electrode and a ground electrode on the top surface of the filter. The protective layer 21 has the same construction as that illustrated in FIG. 12.

With the protective layer, the top surface electrodes and the resistive film are protected from external mechanical impacts (rubbing) and humidity. A highly reliable filter is thus produced.

The protective layer is produced by depositing a liquid resin such as an epoxy resin through the screen printing, and then by curing the resin film by heat or ultraviolet light. The protective layer is also produced by coating a resin, such as polyimide resin appropriate for the photolithographic process, on the entire surface of the filter through spin coating, and then by patterning the resin through exposure and development.

FIG. 15 is an external perspective view of the flat group-delay low-pass filter in accordance with a tenth preferred embodiment of the present invention in its mounted state. The tenth preferred embodiment is a mounted example of the filter chip shown in FIG. 14. Referring to FIG. 15, there are shown external circuit boards 22 having micro strip lines disposed thereon. In this example, a filter chip 30 is arranged between the two external boards 22 with external connection electrodes 19 on the filter chip 30 respectively connected to the micro strip lines on the external circuit boards 22 through wires W.

Figure 16:
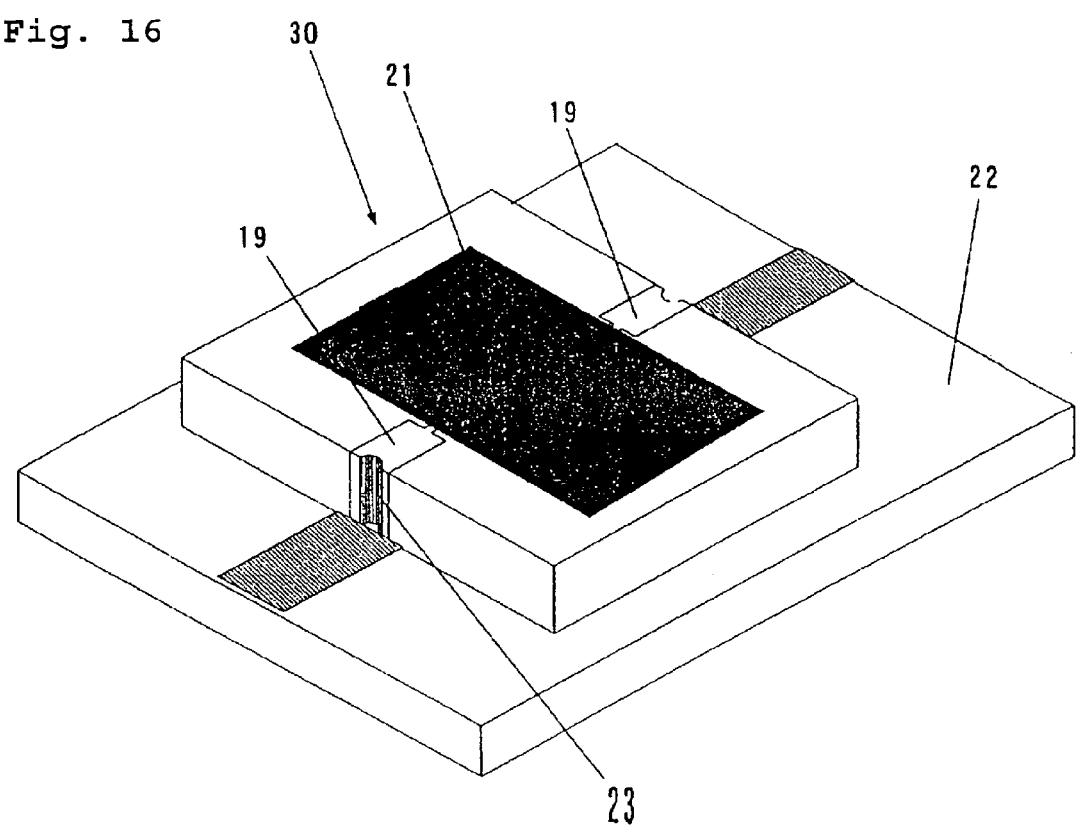
FIG. 16 is an external perspective view of the flat group-delay low-pass filter in accordance with a further preferred embodiment of the present invention in the mounted state thereof.

FIG. 16 is an external perspective view of the flat group-delay low-pass filter in accordance with an eleventh preferred embodiment of the present invention in its mounted state.

Referring to FIG. 16, a filter chip 30 has side electrodes on the side surfaces of the dielectric substrate continued from external connection electrodes. The construction of the top surface of the dielectric substrate remains unchanged from that shown in FIG. 11. In this example, a protective layer 21 covers the top surface of the dielectric substrate.

The filter chip 30 is surface-mounted on an external circuit board 22 through soldering.

By extending the external connection electrode to the side surface of the dielectric substrate, surface mounting is performed using soldering, thereby reducing mounting costs.

Figure 17:
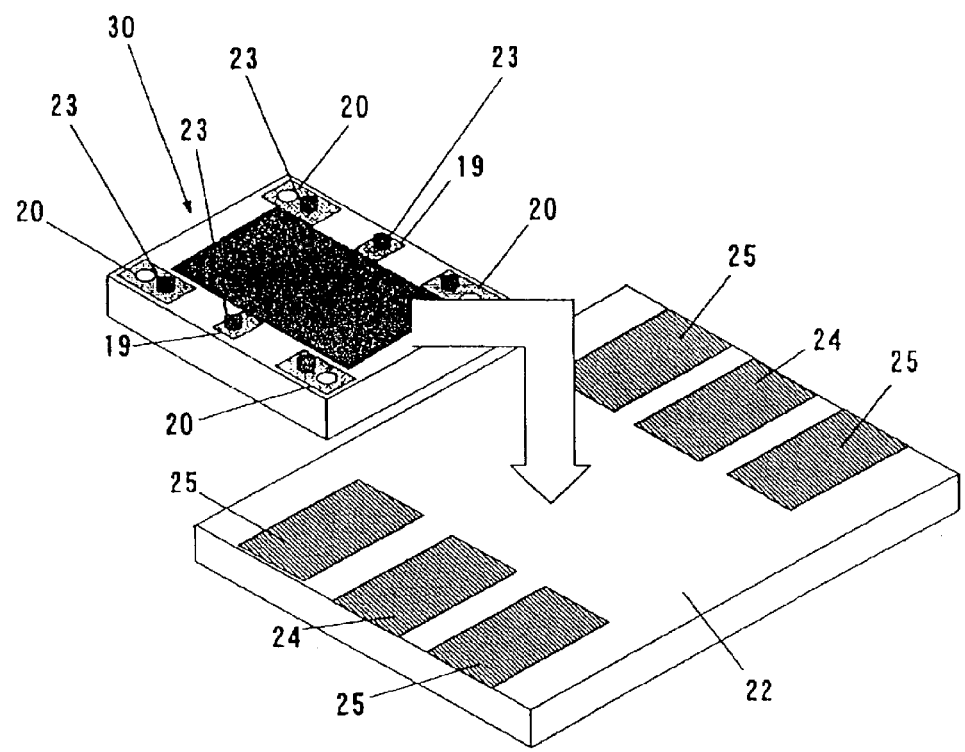
FIG. 17 is an external perspective view of the flat group-delay low-pass filter in accordance with a further preferred embodiment of the present invention in the mounted state thereof.

FIG. 17 is an external perspective view of the flat group-delay low-pass filter in accordance with a twelfth preferred embodiment of the present invention in its mounted state.

Referring to FIG. 17, a filter chip 30 is shown with the mounting surface thereof facing upward. Solder bumps or Au bumps 23 are arranged on external connection electrodes 19 and ground electrodes 20 on both sides thereof on the filter chip. Signal lines 24 and ground electrodes 25, which are respectively put into contact with the bumps 23, are arranged on the external circuit board 22.

The filter chip 30 is flip-chip bonded to the top surface of the external circuit board 22 via the bump formation surface facing the external circuit 22.

The use of wires can vary the characteristics of the filter depending on the length of each wire. If the filter chip is flip-chip bonded, the variations in the filter characteristics are controlled. As a result, the flat group-delay low-pass filter and an optical signal receiver including the filter are produced with a high yield.

The flat group-delay low-pass filter of a thirteenth preferred embodiment of the present invention is now discussed.

The construction of the flat group-delay low-pass filter remains unchanged from that of the flat group-delay low-pass filter illustrated in FIG. 12. However, the external connection electrode 19 and the ground electrode 20 are preferably formed through the thick-film formation process. With this construction, the filter chip is mounted on a package base which is surface mountable on a board. Thus, a surface-mountable flat group-delay low-pass filter device includes the flat group-delay low-pass filter and the package base.

The construction of the optical signal receiver of a fourteenth preferred embodiment is discussed below with reference to FIG. 18.

Figure 18:
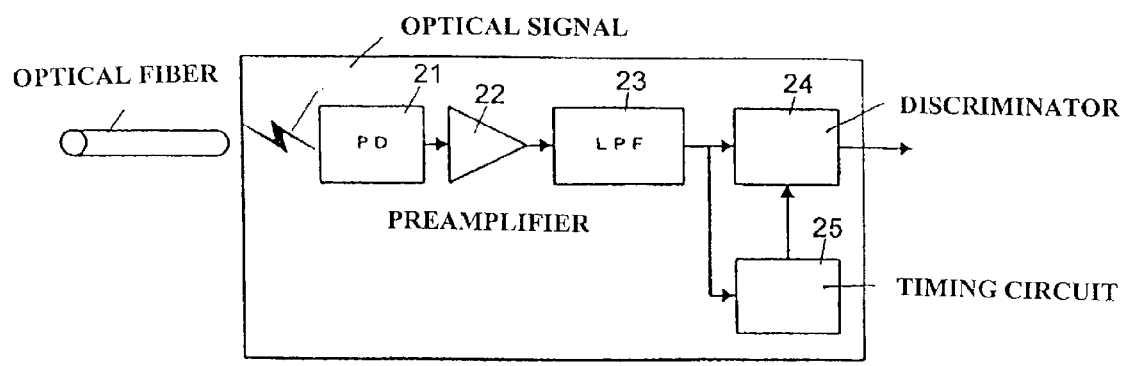
FIG. 18 is a block diagram illustrating the circuit arrangement of the flat group-delay low-pass filter of an optical signal receiver in accordance with another preferred embodiment of the present invention.
Figure 19:
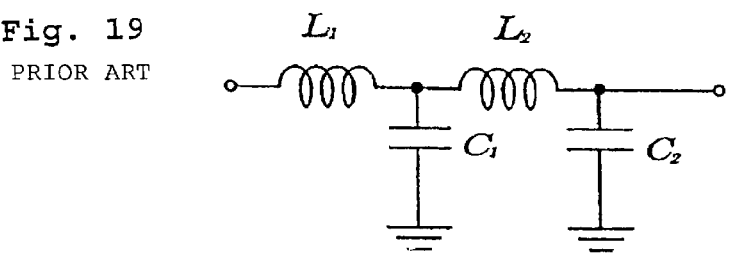
FIG. 19 is a circuit diagram of a conventional Bessel filter.
Figure 20A:
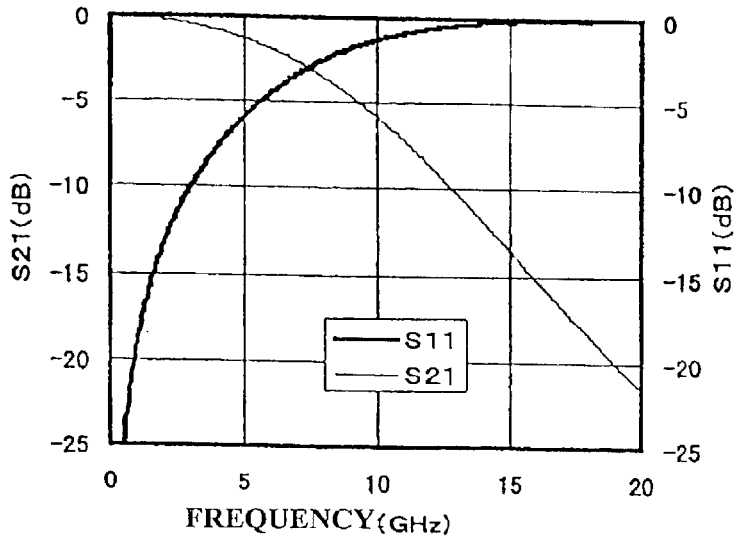
FIGS. 20A and 20B illustrate the reflective characteristics, the transmission characteristics, and the group-delay characteristics of the conventional Bessel filter.
Figure 20B:
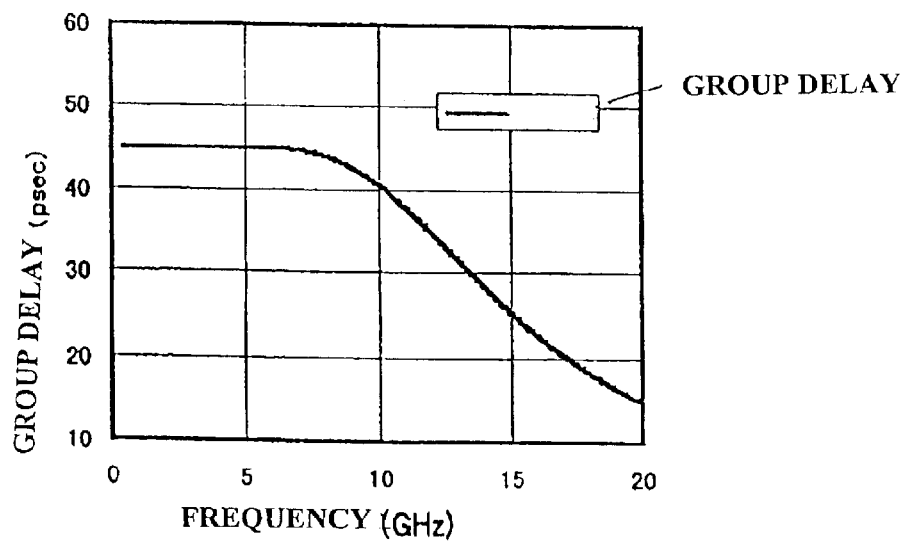

FIG. 18 is a block diagram of the optical signal receiver. Referring to FIG. 18, there is shown a photodiode 21 for receiving an optical signal from an optical fiber. A preamplifier 22 amplifies an electrical signal into which the photodiode 21 converts the optical signal. A flat group-delay low-pass filter 23 preferably has the same structure as that of one of the flat group-delay low-pass filters discussed above. The filter then removes noise components such as harmonic wave components resulting from long-distance transmission and the amplification of the signal. A timing circuit 25 generates a sampling pulse from the digital pattern of the input signal, and feeds the sampling pulse to a discriminator 24. In response to the sampling pulse, the discriminator 24 discriminates "1" and "0" of an equalized wave, and reproduces an original digital pulse pattern.

The optical signal receiver conventionally requires a fixed attenuator in front of the low-pass filter to control the effect of reflections. In accordance with preferred embodiments of the present invention, however, the filter 23 requires no fixed attenuator for the low reflection property thereof.

In accordance with preferred embodiments of the present invention, the flat group-delay low-pass filter includes the series circuit of the resistor with one end thereof grounded, and the capacitor, defining the shunt element, and the inductor defining the series element. This arrangement provides ideal flat group-delay low-pass filter characteristics in a low frequency region, and the low-reflection property with a signal absorbed by the resistor in a high frequency region.

The filter is less susceptible to the effect of the equivalent inductance generated in series with the resistor. Even when the resistor is connected through the wire, variations in the filter characteristics are very small. No adjustment in the characteristics is required, and the cost of the filter is greatly reduced.

In accordance with preferred embodiments of the present invention, the inductor and the capacitor are defined by electrode patterns on the dielectric substrate, and the resistor is defined by the resistive film pattern. Variations in the connection of the elements are thus eliminated, and compact flat group-delay low-pass filters having uniform characteristics result.

In accordance with preferred embodiments of the present invention, the dielectric substrate is mounted on another dielectric substrate having a surface-mountable terminal structure. The series element and the shunt element are precisely arranged. The flat group-delay low-pass filter thus becomes surface mountable on a board.

In accordance with preferred embodiments of the present invention, the optical signal receiver includes the photoelectric converter circuit for converting a received optical signal into an electrical signal, and the flat group-delay low-pass filter which receives the electrical signal from the photoelectric converter circuit and attenuates a high-frequency component of the signal. In the digital communication using the optical fiber, the noise component is removed without degrading the signal waveform. This preferred embodiment of the present invention thus improves an error rate, contributing to a high capacity and long distance optical communication. The conventional fixed attenuator is dispensed with and thus, a low-cost optical signal receiver results.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A flat group-delay low-pass fitter comprising:

a series element connected between an input terminal and an output terminal; and a shunt element having one terminal thereof being grounded;

wherein the series element includes an inductor and the shunt element includes a parallel circuit having a capacitor and a series circuit including a resistor and a capacitor.

2. A flat group-delay low-pass fitter according to claim 1, further comprising a dielectric substrate, wherein the inductor includes a strip fine defined by a line electrode pattern, as an element of the inductor, arranged on the dielectric substrate, each of the capacitors includes an electrode pattern arranged on the dielectric substrate, and the resistor includes a resistive film pattern arranged on the dielectric substrate.

3. A flat group-delay low-pass filter according to claim 1, further comprising a dielectric substrate, wherein the inductor includes a micro strip line defined by a ground electrode arranged on the bottom surface of the dielectric substrate and a line electrode pattern disposed on the top surface of the dielectric substrate, the line electrode pattern of the micro strip line is constructed so that the characteristic impedance of the micro strip line is larger than about 50 Ω, the capacitor includes a ground electrode arranged on the bottom surface of the dielectric substrate, and an electrode pattern arranged on the top surface of the dielectric substrate so that a capacitance is created between the ground electrode and the electrode pattern, the resistor includes a resistive film pattern arranged on the top surface of the dielectric substrate, and an electrode for external connection connected to the electrode pattern of the micro strip line is disposed on the top surface of the dielectric substrate.

4. A flat group-delay low-pass filter according to claim 2, wherein the line electrode pattern is a thin-film pattern with the outermost surface thereof being made of Au, and the resistive film pattern is a thin-film tantalum oxide film.

5. A flat group-delay low-pass filter according to claim 3, further comprising a ground electrode pattern connected to the ground electrode and arranged on at least one of the two side regions of the external connection electrode.

6. A flat group-delay low-pass filter according to claim 2, further comprising a protective layer covering the inductor, the capacitors arid the resistor arranged on the dielectric substrate.

7. A mounting structure for a flat group-delay low-pass filter, further comprising a flat group-delay low-pass filter according to claim 2, wherein the external connection electrode is connected to an external circuit through a wire.

8. A flat group-delay low-pass filter according to claim 2, further comprising a side electrode extending from the external connection electrode and arranged on the side surface of the dielectric substrate.

9. A flat group-delay low-pass filter according to claim 2, further comprising a bump disposed on at feast the external connection electrode on the top surface of the dielectric substrate and arranged to facilitate flip-chip bonding.

10. A flat group-delay low-pass filter device comprising a flat group-delay low-pass filter according to claim 2 and a package base on which the flat group-delay low-pass filter is mounted, wherein the package base has a thick-film terminal electrode for surface-mounting.

11. A flat group-delay low-pass filter according to claim 1, wherein the series element is located at the input terminal and the shunt element is located at the output terminal.

12. A flat group-delay low-pass filter according to claim 1, wherein the series element is located at the input terminal and another series element is located at the output terminal.

13. A flat group-delay low-pass filter according to claim 1, wherein the shunt element is located at the input terminal and another shunt element is located at the output terminal.

14. A flat group-delay low-pass filter according to claim 1, wherein the capacitors, the inductor and the resistor each includes a metal ribbon.

15. A flat group-delay low-pass filter according to claim 1, wherein the filter has at least four stages.

16. A flat group-delay low-pass filter according to claim 1, further comprising a protective layer covering the capacitors, the inductor and the resistor.

17. An optical signal receiver comprising a photoelectric converter circuit for converting a received optical signal into an electrical signal, and a flat group-delay low-pass filter according to claim 1.

* * * * *